(12) United States Patent
Zhang et al.

(10) Patent No.: US 7,102,348 B2
(45) Date of Patent: Sep. 5, 2006

(54) MRI METHOD AND APPARATUS FOR FASTER DATA ACQUISITION OR BETTER MOTION ARTIFACT REDUCTION

(75) Inventors: Qiang Zhang, Chicago, IL (US); Orlando Simonetti, Chicago, IL (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/911,795

(22) Filed: Aug. 5, 2004

(65) Prior Publication Data

US 2006/0028206 A1 Feb. 9, 2006

(51) Int. Cl.
*G01V 3/00* (2006.01)

(52) U.S. Cl. ..................................................... 324/309

(58) Field of Classification Search ................ None
See application file for complete search history.

(56) References Cited

U.S. PATENT DOCUMENTS

| | | | |
|---|---|---|---|
| 6,841,998 B1 | 1/2005 | Griswold | |
| 6,853,191 B1 * | 2/2005 | Miller et al. | 324/309 |
| 6,882,148 B1 * | 4/2005 | Pipe | 324/307 |
| 7,023,207 B1 * | 4/2006 | Gaddipati et al. | 324/309 |
| 2005/0073303 A1 * | 4/2005 | Harer et al. | 324/307 |

OTHER PUBLICATIONS

"The Use of Parallel Imaging with PROPELLER DWI," Pipe, Proc. Intl. Soc. Mag. Reson. Med. 11 (Jul. 10-16, 2003), p. 66.
"Periodically Rotated Overlapping ParallEL Lines with Enhanced Reconstruction (PROPELLER) MRI: Application to Motion Correction," Pipe, Proc. Intl. Magn. Reson. Med. 7 (1999), p. 242.
"Motion Correction with PROPELLER MRI: Application to Head Motion and Free-Breathing Cardiac Imaging," Pipe, Mag. Res. in Med., vol. 42 (1999), pp. 953-969.
"Turboprop—An Improved PROPELLER Sequence for Diffusion Weighted MRI," Pipe, Proc. Intl. Soc. Mag. Reson. Med. 10 (2002).
"Recent Advances in Image Reconstruction, Coil Sensitivity Calibration, and Coil Array Design for SMASH and Generalized Parallel MRI," Sodickson et al., Magnetic Resonance Materials in Physics, Biology and Medicine, vol. 13 (2002), pp. 158-163.
"Generalized SMASH Imaging," Bydder et al., Mag. Res. in Med., vol. 47 (2002), pp. 160-170.
"SENSE: Sensitivity Encoding for Fast MRI," Pruessmann et al., Mag. Res. in Med., vol. 42 (1999), pp. 952-962.
"Advances in Sensitivity Encoding with Arbitrary κ-Space Trajectories," Pruessmann et al. Mag. Res. in Med., vol. 46 (2001) pp. 638-651.

* cited by examiner

*Primary Examiner*—Diego Gutierrez
*Assistant Examiner*—Dixomara Vargas
(74) *Attorney, Agent, or Firm*—Schiff Hardin LLP

(57) ABSTRACT

In a method and apparatus for generating a magnetic resonance image, raw magnetic resonance data are acquired from a subject for each of a number of PROPELLER strips using, for each strip, multiple magnetic resonance reception coils in a partial acquisition technique (PAT), and the raw data in said PROPELLER strips are entered into k-space according to the PROPELLER scan. A PAT reconstruction of the data in k-space is conducted dependent on the respective sensitivities of the reception coils, and a PROPELLER reconstruction of the data in k-space is conducted after the PAT reconstruction for generating a magnetic resonance image of the subject.

12 Claims, 4 Drawing Sheets

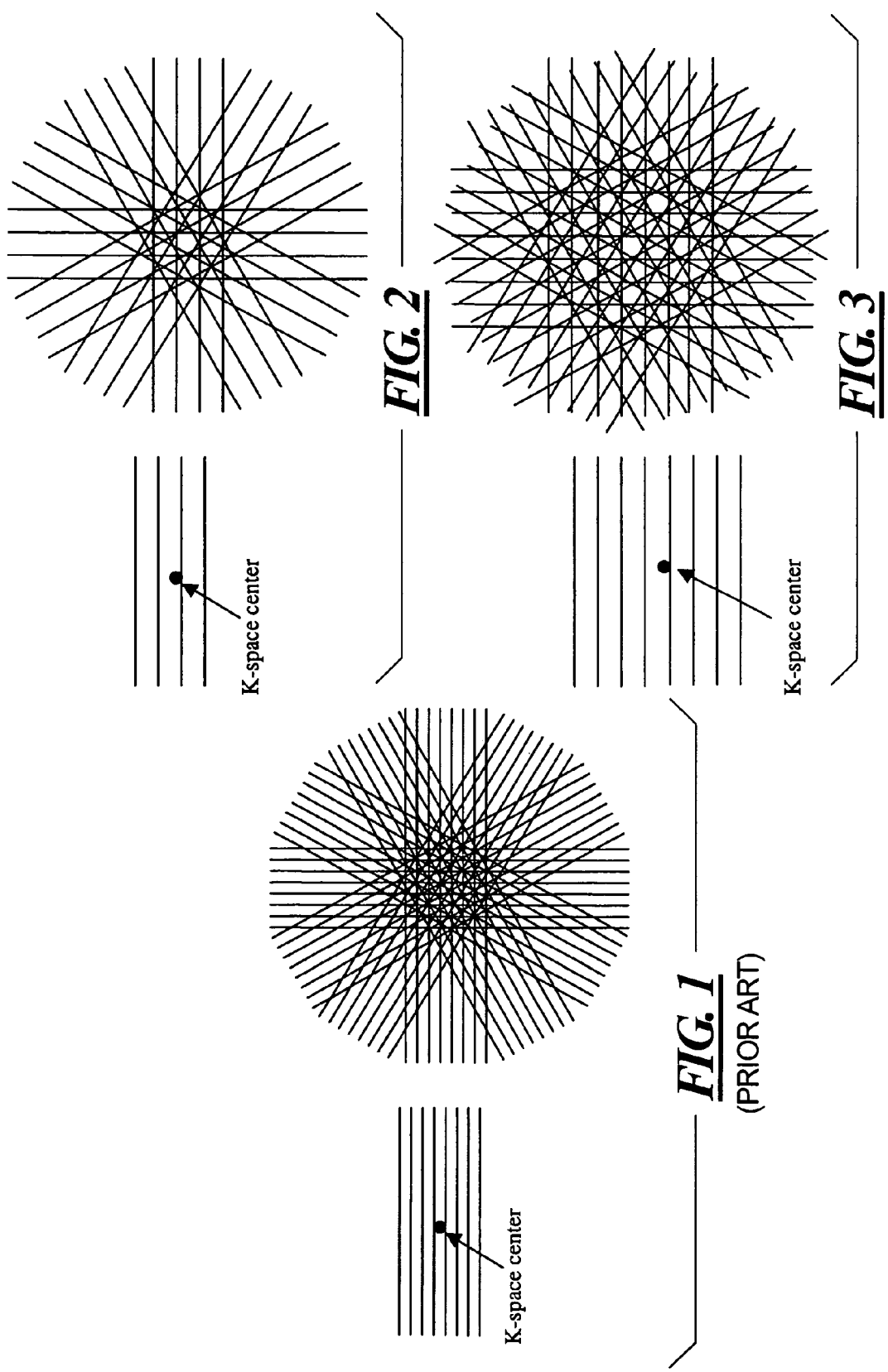

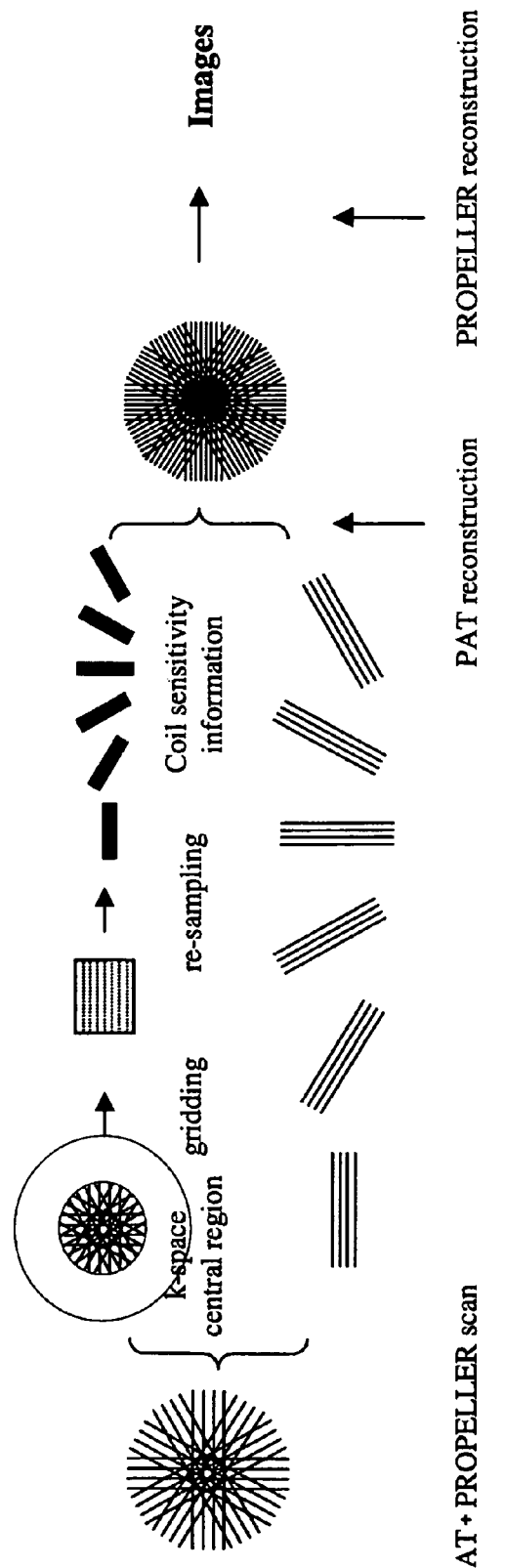
FIG. 6A
FIG. 6B

MRI METHOD AND APPARATUS FOR FASTER DATA ACQUISITION OR BETTER MOTION ARTIFACT REDUCTION

BACKGROUND OF THE INVENTION

1. Field of the Invention

The present invention is directed to a method and an apparatus for magnetic resonance imaging (MRI), and in particular to such a method and apparatus making use of the known PROPELLER technique.

2. Description of the Prior Art

Magnetic resonance imaging (MRI), also known as magnetic resonance tomography (MRT), is a known technique for obtaining images of the inside of the body of an object under investigation, such as a patient. For this purpose, a magnetic resonance apparatus has a space for receiving the examination subject. A basic field magnet system of the apparatus generates a static magnetic field in an imaging volume within the examination space that is as homogenous as possible. This basic magnetic field orders or aligns the nuclear spins of the nuclei in the subject, which were previously randomly oriented. A radio-frequency (RF) antenna system is also a part of the apparatus, and includes an RF transmission coil and at least one RF reception coil. In some instances, the RF transmission coil and the RF reception coil may be the same. RF energy is irradiated into the examination subject by the RF transmission coil, causing magnetic resonance signals to be generated in the subject, which are detected (received) by the RF reception coil or coils.

The received, analog magnetic resonance signals are converted into digital signals, and represent a so-called raw data set. The raw data set is stored electronically in a mathematical domain known as k-space. By means of a Fourier transformation, the data in k-space are transformed into image data, from which an image of a slice of the examination subject is reconstructed.

Particularly in the case of cardiac MRI, two problems are persistent, namely patient motion, including respiratory motion, during data acquisition, and a relatively long data acquisition time. Such problems also exist in other types of MRI such as, for example, functional MRI (fMRI).

Two prevalent techniques are currently employed for reducing motion artifacts in the image, namely the use of navigator echoes, and the use of a special k-space trajectory. The k-space trajectory defines the path or sequence that the raw data are entered into k-space. "Empty" k-space can be considered as a grid or raster or matrix with a number of locations that need to be filled (entered) with data. Many known MRI protocols fill k-space along a serpentine path proceeding row-by-row. For reducing motion artifacts, it is known to employ different types of k-space trajectories, such as radial and spiral trajectories. A known version employing a radial trajectory is called PROPELLER. The PROPELLER technique or method is described in "Periodically Rotated Overlapping Parallel Lines with Enhanced Reconstruction (PROPELLER) MRI; Application to Motion Correction," Pipe, ISMRM 1999, page 242; "Motion Correction with PROPELLER MRI: Application to Head Motion and Free-Breathing Cardiac Imaging," Pipe, MRM Vol. 42 (1999), pages 963–969; "Multishot Diffusion-Weighted FSE With PROPELLER," Pipe, ISMRM 2001, page 166 and "Turboprop-An Improved PROPELLER Sequence for Diffusion-Weighted MRI," Pipe, ISMRM 2002, page 435.

The PROPELLER technique has proven to be a good solution for reducing motion artifacts, but it requires an additional $\pi/2$ imaging time, due to the necessity of oversampling the central region of k-space.

Moreover, two primary methods for speeding up image acquisition are known, these being partial k-space acquisition and parallel acquisition techniques (PAT). Parallel acquisition techniques employ multiple reception coils, usually arranged in a coil array, for simultaneously receiving the magnetic resonance signals from the subject. No single coil in the array receives sufficient signals (data) for reconstructing an entire image of the subject, and therefore it is necessary to combine the signals respectively received by the individual coils in order to produce data for the overall image. This in turn requires that information regarding the respective locations and/or sensitivities of the individual coils be known so that their respective data contributions to the overall image can be appropriately weighted.

Parallel acquisition techniques are described, for example, in "Recent Advances In Image Reconstruction, Coil Sensitivity Calibration, and Coil Array Design For SMASH and Generalized Parallel MRI," Sodickson et al., MAGMA, Vol. 13, No. 3 (January 2002), pages 158–163; "Generalized SMASH Imaging," Bydder et. al., Magnetic Resonance in Medicine, Vol. 47, No. 1 (January 2002), pages 160–170 and "SENSE: Sensitivity Encoding for Fast MRI," Preussmann et al., Magnetic Resonance in Medicine, Vol. 42, No. 5 (November 1999) pages 952–962.

Thus far, however, parallel acquisition techniques have been successfully applied primarily in the case of rectilinear (row-by-row) k-space acquisition. The applicability of PAT to arbitrary k-space trajectories is under research, as described in "Advances in Sensitivity Encoding with Arbitrary k-space Trajectories," Preussmann et al., Magnetic Resonance in Medicine, Vol. 46 (2001), pages 638–651.

SUMMARY OF THE INVENTION

An object of the present invention is to provide a method for operating a magnetic resonance imaging apparatus which takes advantage of the motion artifact reduction achieved with the PROPELLER technique, but alleviates the disadvantage of the longer time for data acquisition associated with the PROPELLER technique.

A further object of the present invention is to provide a magnetic resonance imaging apparatus for implementing such a method.

The above object is achieved in accordance with the principles of the present invention in a method and apparatus wherein the magnetic resonance raw data are acquired from the subject using a partial acquisition technique, and are entered into k-space according to the PROPELLER technique. The more rapid data acquisition that is achieved by the use of PAT, such as partial parallel acquisition (PPA), compensates for the additional imaging time associated with the PROPELLER technique, due to the oversampling of the central region in k-space.

In a conventional PROPELLER data acquisition, PROPELLER data are collected in k-space in a number of strips, with each strip consisting of L parallel linear trajectories. Each strip is rotated in k-space by an angle, so that the total dataset spans a circle in k-space. In accordance with the inventive method and apparatus, each strip is acquired according to a parallel acquisition technique, thereby reducing the amount of time needed for the acquisition of each strip. The parallel acquisition technique that is used can operate so that only a portion of L lines, for example, L/2, is acquired in each strip. Alternatively, the width of each strip can be expanded.

The coil sensitivity information needed for PAT can be obtained by different techniques. In one embodiment, a separate, conventional PROPELLER scan is conducted as a reference scan, from which the information needed for PAT can be extracted. In a further embodiment, the common central k-space region that is acquired by all of the strips is extracted, and a gridding algorithm is applied to obtain coil sensitivity information. The coil sensitivity information is then re-sampled for each PROPELLER strip.

The magnetic resonance imaging apparatus in accordance with the invention has a scanner adapted to receive a patient therein, the scanner having a basic field magnet, an RF antenna system composed of at least one transmission coil and multiple reception coils, and a gradient field system. The sequence controller or the control computer for the scanner operates the scanner to execute a combined PAT and PROPELLER sequence (protocol) and the image computer processes the digital data acquired from the scanner, after analog-to-digital conversion thereof, in accordance with the method described above.

The method and apparatus of the invention have several advantages. The PROPELLER technique proceeds more quickly because only a part of the conventionally acquired L lines is acquired in each strip in accordance with the invention. Nevertheless, the excellent motion correction achieved by PROPELLER is retained. The data acquisition time is comparable to that of non-PROPELLER scans. In the embodiment wherein the propeller strips are wider, better motion correction is achieved than with a conventional propeller technique, due to more accurate low-resolution phase maps. In this embodiment, the data acquisition time is the same, or may even be shorter, than that of a conventional PROPELLER scan.

Existing partial acquisition techniques, such PPA, are readily applicable because the parallel linear trajectories in each strip in a conventional PROPELLER scan correspond to phase-encoding k-space lines in a conventional rectilinear k-space trajectory.

DESCRIPTION OF THE DRAWINGS

FIG. 1 is a schematic illustration for explaining a conventional PROPELLER scan.

FIG. 2 is a schematic illustration for explaining a first embodiment of a PAT+PROPELLER scan in accordance with the invention, in a first embodiment for data acquisition.

FIG. 3 is a schematic illustration for explaining a PAT+PROPELLER scan in accordance with the invention, in a second embodiment for data acquisition.

FIGS. 6A and 6B schematically illustrate a second embodiment of a sequence for data acquisition and image reconstruction in accordance with the invention.

DESCRIPTION OF THE PREFERRED EMBODIMENTS

Figure 4:
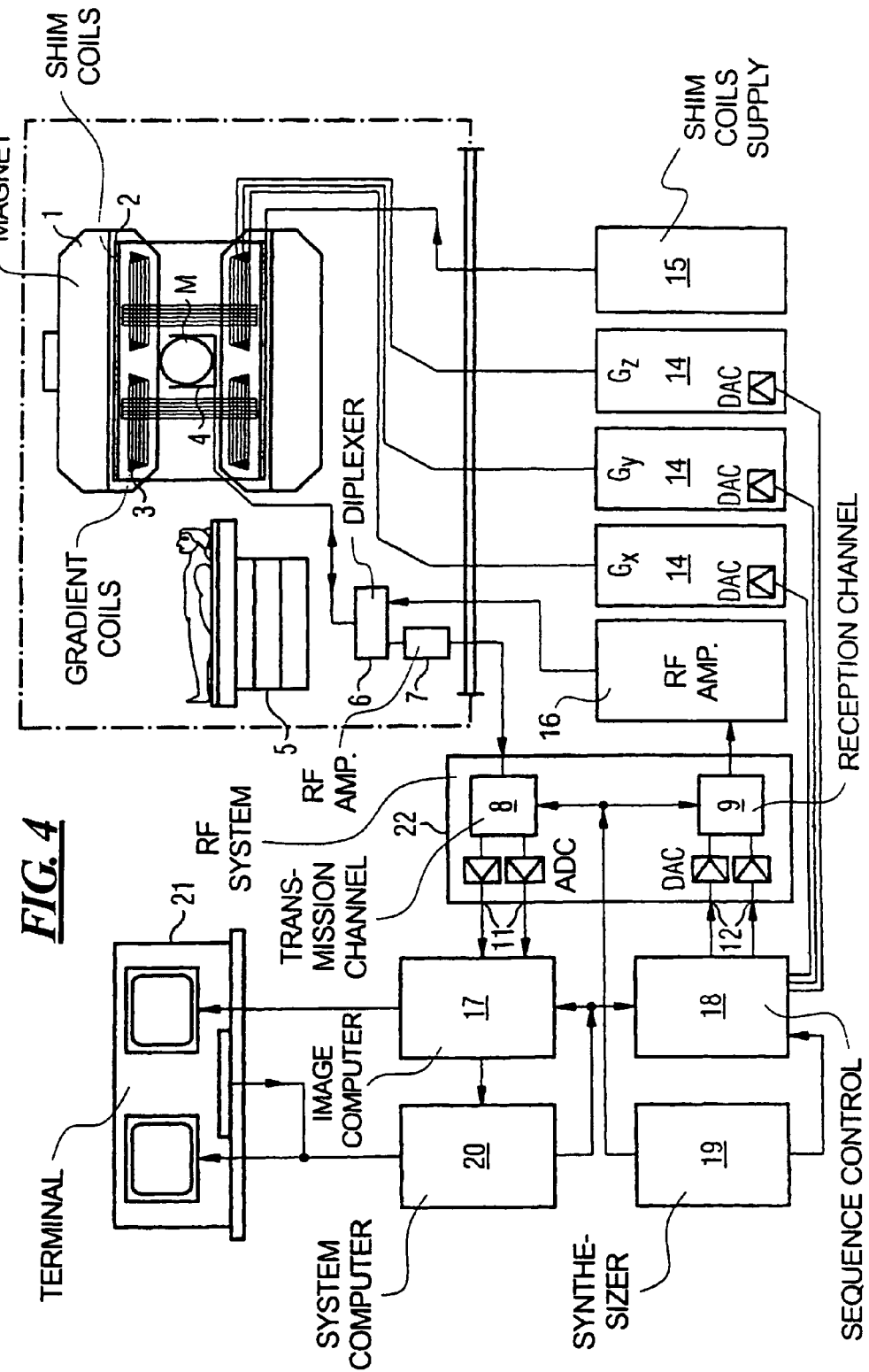
FIG. 4 is a schematic block diagram of a magnetic resonance imaging apparatus constructed and operating in accordance with principles of the present invention.

FIG. 1 schematically illustrates the concept underlying a conventional PROPELLER scan. Data are acquired in k-space in N strips, each consisting of L parallel lines, corresponding to the L lowest frequency phase-encoding lines in any Cartesian-based data acquisition technique. Each strip is rotated in k-space by an angle $a=\pi/n$, so that the total dataset spans a circle in k-space. If a matrix having diameter M is desired, then L and N are chosen so that $L \cdot N = M \cdot \pi/2$. The central circle in k-space, having a diameter L, is acquired for each of the N strips, which are respectively used to form N low-resolution images. These low-resolution images are compared to each other to remove in-plane displacement and phase errors, which are slowly varying in the spatial domain. These factors are corrected for each strip. A suitable technique such as cross-correlation is employed to determine which strips were acquired with significant through-plane displacement. As the data are combined in k-space, the data from strips with the least amount of through-plane motion are preferentially used in regions of strip overlap, so that artifacts arising from through-plane motion are reduced. This basic description of the conventional PROPELLER technique is taken from the aforementioned article by Pipe ("Periodically Rotated Overlapping Parallel Lines with Enhanced Reconstruction (PROPELLER) MRI; Application to Motion Correction").

In a first embodiment for data acquisition in accordance with the invention shown in FIG. 2, a partial acquisition technique, such as PPA, is employed to acquire, in each strip, only a portion of the conventionally acquired L lines, for example, L/2 lines. This significantly shortens the data acquisition time for each strip. These strips with a reduced number of lines are entered in k-space as in a conventional PROPELLER scan.

Another alternative for data acquisition in accordance with the invention is shown in FIG. 3, wherein the width of each strip is expanded, and the expanded strips are entered into k-space as in a conventional PROPELLER scan. The data acquisition time is the same or shorter than that of a conventional PROPELLER scan, but the motion artifact reduction is even further improved.

Thus a choice can be made as to whether, for a particular examination, a shorter data acquisition time or better motion artifact reduction is more important.

As noted above, one suitable partial acquisition technique that can be used in accordance with the invention is partial parallel acquisition (PPA). Examples of this technique are described in co-pending application Ser. No. 10/117,396, filed Apr. 5, 2002 ("Magnetic Resonance Imaging Method and Apparatus Employing Partially Parallel Acquisition," Griswold) and co-pending application Ser. No. 10/355,737, filed Jan. 31, 2003 ("Method and Magnetic Resonance Apparatus for Calibrating Coil Sensitivities, Zhang et al.). The teachings of both of these co-pending applications are incorporated herein by reference.

FIG. 4 schematically illustrates a magnetic resonance imaging (tomography) apparatus for generating a nuclear magnetic image of a subject according to the present invention. The components of the nuclear magnetic resonance tomography apparatus correspond to those of a conventional tomography apparatus, but it is controlled according to the invention. A basic field magnet 1 generates a time-constant, intense magnetic field for polarization (alignment) of the nuclear spins in the examination region of a subject such as, for example, a part of a human body to be examined. The high homogeneity of the basic magnetic field required for the nuclear magnetic resonance measurement is defined in a spherical measurement volume M in which the part of the human body to be examined is introduced. For supporting the homogeneity demands and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 is built into the basic field magnet 1, the system 3 being composed of three sub-windings. Each sub-winding is supplied with current by an amplifier 14 for generating a linear gradient field in the respective directions of a Cartesian coordinate system. The first sub-winding of the gradient field system 3 generates a gradient Gx in the x-direction, the second sub-winding generates a gradient Gy in the y-direction, and the third sub-winding generates a gradient Gz in the z-direction. Each amplifier 14 has a digital-to-analog converter DAC that is driven by a sequence control 18 for the time-controlled generation of gradient pulses.

A radio-frequency antenna 4 is situated within the gradient field system 3. The antenna 4 converts the radio-frequency pulses emitted by a radio-frequency power amplifier into an alternating magnetic field for exciting the nuclei and aligning the nuclear spins of the subject under examination, or of a region of the subject under examination. The radio-frequency antenna 4 is composed of one or more RF transmission coils and a number of RF reception coils in the form of an arrangement (preferably linear) of component coils. The alternating field proceeding from the precessing nuclear spins, i.e. the nuclear spin echo signals produced as a rule by a pulse sequence composed of one or more radio-frequency pulses and one or more gradient pulses, is also converted into a voltage by the RF reception coils of the radio-frequency antenna 4, this voltage being supplied via an amplifier 7 to a radio-frequency reception channel 8 of a radio-frequency system 22. The radio-frequency system 22 also has a transmission channel 9 wherein the radio-frequency pulses are generated for exciting magnetic nuclear resonance. The respective radio-frequency pulses are digitally presented as a sequence of complex numbers on the basis of a pulse sequence in the sequence control 18 prescribed by the system computer 20. This number sequence—as a real part and an imaginary part—is supplied via respective inputs 12 to a digital-to-analog converter DAC in the radio-frequency system 22 and is supplied from there to a transmission channel 9. In the transmission channel 9, the pulse sequences are modulated onto a radio-frequency carrier signal having a basic frequency corresponding to the resonant frequency of the nuclear spins in the measurement volume.

The switching from transmission mode to reception mode ensues via a transmission/reception diplexer 6. The RF transmission coil of the radio-frequency antenna 4 radiates the radio-frequency pulses, based on signals from a radio-frequency amplifier 16, for excitation of the nuclear spins into the measurement volume M and samples the resulting echo signals via the RF reception coils. The acquired nuclear magnetic resonance signals are phase-sensitively demodulated in the reception channel 8 of the radio-frequency system 22 and are converted via respective analog-to-digital converters ADC into the real part and the imaginary part of the measured signal, which are respectively supplied to outputs 11. An image computer 17 reconstructs an image from the measured data acquired in this way (including, when appropriately programmed or instructed, organizing the data in accordance with the invention). Administration of the measured data, the image data and the control programs ensues via the system computer 20. On the basis of control programs, the sequence control 18 monitors the generation of the respectively desired pulse sequences and the corresponding sampling of k-space. In particular, the sequence control 18 controls the tined switching of the gradients, the emission of the radio-frequency pulses with defined phase and amplitude, as well as the reception of the nuclear magnetic resonance signals in accordance with the invention according to a control program designed to implement the inventive method. The timing signals for the radio-frequency system 22 and the sequence control 18 is made available by a synthesizer 19. The selection of corresponding control programs for generating a nuclear magnetic resonance image as well as the presentation of the generated nuclear magnetic resonance image ensues via a terminal 21 that has a keyboard as well as one or more picture screens.

As noted above, in partial acquisition techniques such as PPA, coil sensitivity information is needed in order to weight the respective data contributions represented by the respective signals received by the multiple reception coils. In a first embodiment in accordance with the invention, this is achieved in a sequence schematically indicated in FIG. 5A by first conducting a traditional (conventional) PROPELLER scan (i.e., a PROPELLER scan wherein data for the strips are not acquired simultaneously with multiple coils). This conventional PROPELLER scan is then used as a reference. This is followed by acquisition of the data for PROPELLER strip 1 using a partial acquisition technique, acquisition of the data for PROPELLER strip 2 using a partial acquisition technique, and so forth until the data for all of the PROPELLER strips have been acquired.

Figure 5A:
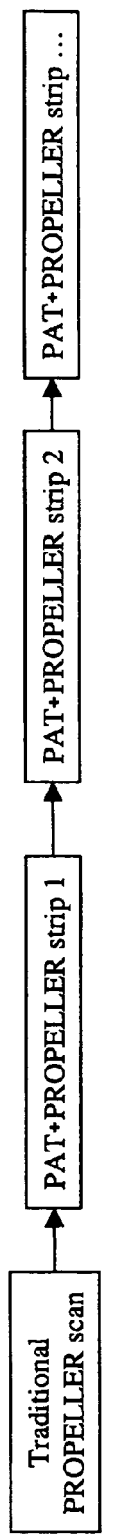
FIGS. 5A and 5B schematically illustrate a first embodiment of a data acquisition sequence and image reconstruction in accordance with the invention.
Figure 5B:
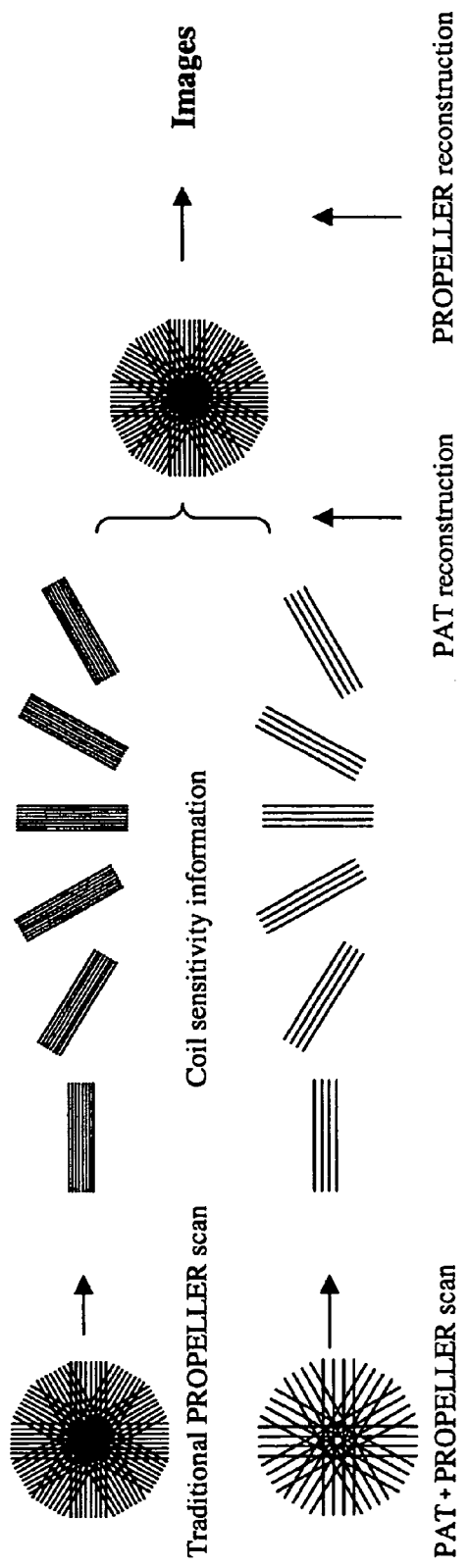

In the image reconstruction in this first embodiment that is schematically illustrated in FIG. 5B, the coil sensitivity information obtained from the conventional PROPELLER scan is then used for weighting the data contributions of the respective PAT+PROPELLER scans, so that a PAT reconstruction is first performed. This is then followed by a PROPELLER image reconstruction, to obtain the images.

In a further embodiment illustrated in FIGS. 6A and 6B, data are acquired for each PROPELLER strip using a partial acquisition technique (FIG. 5A). This results in a common, central region of k-space that has been acquired by all of the strips. A suitable known gridding algorithm is then applied to the data in this central region to obtain the coil sensitivity information. The coil sensitivity information is then re-sampled for each PROPELLER strip, to obtain the necessary coil sensitivity information, which is then used for the PAT reconstruction. A PROPELLER reconstruction is then implemented as described above, to obtain the necessary images.

Although modifications and changes may be suggested by those skilled in the art, it is the intention of the inventors to embody within the patent warranted hereon all changes and modifications as reasonably and properly come within the scope of their contribution to the art.

We claim:

1. A method for generating a magnetic resonance image comprising the steps of:
   for a PROPELLER scan, acquiring raw magnetic resonance data from a subject for each of a plurality of PROPELLER strips with a plurality of magnetic resonance reception coils using a partial acquisition technique (PAT), each of said magnetic resonance reception coils having a coil sensitivity;
   entering said raw data in said plurality of PROPELLER strips into k-space according to said PROPELLER scan;
   conducting a PAT reconstruction of the data in k-space dependent on the respective coil sensitivities; and conducting a PROPELLER reconstruction of said data in k-space after said PAT reconstruction for generating a magnetic resonance image of the subject.

2. A method as claimed in claim 1 wherein PROPELLER strips in a conventional PROPELLER scan each occupy a plurality of lines of data in k-space, and wherein the step of acquiring raw magnetic resonance data from a subject for each of a plurality of PROPELLER strips comprises acquiring magnetic resonance data from a subject for each of a plurality of PROPELLER strips occupying a plurality of lines in k-space that is less than said plurality of lines occupied in k-space by each PROPELLER strip of said conventional PROPELLER scan.

3. A method as claimed in claim 1 wherein a PROPELLER strip of a conventional PROPELLER scan occupies a width in k-space, and wherein the step of acquiring raw magnetic resonance data from a subject for each of a plurality of PROPELLER strips comprises acquiring raw magnetic resonance data from a subject for each of a plurality of PROPELLER strips occupying a width in k-space that is greater than said width in k-space occupied by each PROPELLER strip in said conventional PROPELLER scan.

4. A method as claimed in claim 1 comprising obtaining raw magnetic resonance data from the subject with a conventional PROPELLER scan, without PAT, and using said raw magnetic resonance data from said conventional PROPELLER scan as a reference for designating said coil sensitivities in said PAT reconstruction.

5. A method as claimed in claim 1 wherein k-space had a central region wherein all of said plurality of PROPELLER strips overlap, and comprising applying a gridding algorithm to said central region for obtaining information describing said respective coil sensitivities for use in said PAT reconstruction.

6. A method as claimed in claim 1 comprising employing partial parallel acquisition as said PAT.

7. A magnetic resonance imaging apparatus comprising:
a magnetic resonance scanner having an antenna array including a plurality of reception coils, each of said reception coils having a coil sensitivity;
a sequence controller connected to said magnetic resonance scanner for operating said magnetic resonance scanner for acquiring raw magnetic resonance data from a subject for each of a plurality of PROPELLER strips in a PROPELLER scan with said plurality of reception coils using a partial acquisition technique (PAT); and
an image computer supplied with said raw magnetic resonance data for entering said raw magnetic resonance data in said plurality of PROPELLER strips into k-space according to said PROPELLER scan, conducting a PAT reconstruction of said data in k-space dependent on the respective coil sensitivities and for conducting a PROPELLER reconstruction of said data in k-space after said PAT reconstruction for generating a magnetic resonance image of the subject.

8. An apparatus as claimed in claim 7 wherein PROPELLER strips in a conventional PROPELLER scan each contain a plurality of lines of data in k-space, and wherein said sequence controller operates said magnetic resonance scanner for acquiring raw magnetic resonance data from a subject for each of a plurality of PROPELLER strips occupying a plurality of lines in k-space that is less than said plurality of lines occupied in k-space by each strip of said conventional PROPELLER scan.

9. An apparatus as claimed in claim 7 wherein a PROPELLER strip of a conventional PROPELLER scan occupies a width in k-space, and wherein said sequence controller operates said magnetic resonance scanner for acquiring raw magnetic resonance data from a subject for each of a plurality of PROPELLER strips occupying a width in k-space that is greater than said width in k-space occupied by each PROPELLER strip in said conventional PROPELLER scan.

10. An apparatus as claimed in claim 7 wherein said sequence controller operates said magnetic resonance scanner for obtaining raw magnetic resonance data from the subject with a conventional PROPELLER scan, without PAT, and wherein said image computer uses said raw magnetic resonance data from said conventional PROPELLER scan as a reference for designating said coil sensitivities in said PAT reconstruction.

11. An apparatus as claimed in claim 7 wherein k-space has a central region wherein all of said plurality of PROPELLER strips overlap, and wherein said image computer applies a gridding algorithm to said central region for obtaining information describing said respective coil sensitivities for use in said PAT reconstruction.

12. An apparatus as claimed in claim 7 wherein said sequence controller operates said magnetic resonance scanner for employing partial parallel acquisition as said PAT.

* * * * *